US008725466B2

(12) United States Patent
Santina et al.

(10) Patent No.: US 8,725,466 B2
(45) Date of Patent: May 13, 2014

(54) SYSTEM AND METHOD FOR HYBRID SOLID AND SURFACE MODELING FOR COMPUTER-AIDED DESIGN ENVIRONMENTS

(75) Inventors: Rami Santina, Beirut (LB); Zuhair Haddad, Athens (GR); Rayan Jreije, Athens (GR)

(73) Assignee: CCT International, Inc., Athens (GR)

( * ) Notice: Subject to any disclaimer, the term of this patent is extended or adjusted under 35 U.S.C. 154(b) by 818 days.

(21) Appl. No.: 12/578,521

(22) Filed: Oct. 13, 2009

(65) Prior Publication Data

US 2010/0179788 A1    Jul. 15, 2010

Related U.S. Application Data

(60) Provisional application No. 61/196,157, filed on Oct. 14, 2008, provisional application No. 61/166,669, filed on Apr. 3, 2009.

(51) Int. Cl.
| | | |
|---|---|---|
| G06F 17/50 | (2006.01) | |
| G06T 17/10 | (2006.01) | |
| G06T 17/20 | (2006.01) | |
| H04N 21/234 | (2011.01) | |
| H04N 21/44 | (2011.01) | |

(52) U.S. Cl.
CPC ............ G06F 17/5004 (2013.01); G06T 17/10 (2013.01); G06T 17/20 (2013.01); H04N 21/23412 (2013.01); H04N 21/44012 (2013.01)
USPC ............................................................ 703/1

(58) Field of Classification Search
CPC ..... G06F 17/5004; G06T 17/10; G06T 17/20; H04N 21/23412; H04N 21/44012
USPC ................................................................ 703/1
See application file for complete search history.

(56) References Cited

U.S. PATENT DOCUMENTS

| | | | | |
|---|---|---|---|---|
| 6,629,065 | B1 * | 9/2003 | Gadh et al. ........................ 703/1 |
| 6,842,175 | B1 * | 1/2005 | Schmalstieg et al. ......... 345/427 |
| 8,072,456 | B2 * | 12/2011 | Mech ............................. 345/428 |
| 2004/0012602 | A1 * | 1/2004 | Mech ............................ 345/581 |
| 2004/0012603 | A1 * | 1/2004 | Pfister et al. .................. 345/582 |
| 2008/0043023 | A1 * | 2/2008 | Loop et al. .................... 345/441 |

FOREIGN PATENT DOCUMENTS

| | | |
|---|---|---|
| EP | 1 304 655 | 4/2003 |
| WO | WO 01/48697 | 7/2001 |
| WO | WO 2006/058165 | 6/2006 |

OTHER PUBLICATIONS

Denis Zorin, Peter Schroder, Wim Sweldens, "Interactive Multiresolution Mesh Editing" Caltech, Bell Laboratories, 2000, 10 pages.*

(Continued)

*Primary Examiner* — Dwin M Craig
(74) *Attorney, Agent, or Firm* — Knobbe, Martens, Olson & Bear, LLP

(57) ABSTRACT

Systems and methods for modeling computer-aided design (CAD) environments and objects are disclosed. The systems and methods provided herein comprise a hybrid between solid modeling and surface modeling. The methods and systems are directed to structures that represent objects and rendering of the objects. The hybrid solution combines the modeling features and rules of solid modeling and the performance abilities provided by surface modeling.

28 Claims, 11 Drawing Sheets

(56) References Cited

OTHER PUBLICATIONS

Arikawa M et al. "Dynamic LOD for QOS Management in the Next Generation VRML." Proceedings of the International Conference on Multimediacomputing and Systems, Los Alamito, CA, US, 17 Une 1996 (Jun. 17, 1996), pp. 24-27, XP002060163.

International Search Report and Written Opinion of the International Searching Authority, or the Declaration, mailed on Jan. 29, 2010, International Application No. PCT/IB2009/007319, filed on Oct. 13, 2009.

International Preliminary Report on Patentability, dated Feb. 7, 2011, International Application No. PCT/IB2009/007319 filed on Oct. 13, 2009.

Bajaj, Chandrajit L. et al., Progressive Compression and Transmission of Arbitrary Triangular Meshes, Department of Computer Sciences, University of Texas at Austin, Austin, TX 78712. 1999. pp. 1-18.

Buchele, Suzanne F., et al. Three-Dimensional Halfspace Constructive Solid Geometry Tree Construction from Implicit Boundary Representations, Proceedings of the Eighth ACM Symposium on Solid Modeling and Applications (Seattle, Washington, USA, Jun. 16-20, 2003). pp. 135-144.

Caumon, G., Sword, C. H., and Mallet, J. 2003. Constrained modifications of non-manifold B-reps, Proceedings of the Eighth ACM Symposium on Solid Modeling and Applications (Seattle, Washington, USA, Jun. 16-20, 2003). pp. 310-315.

Cignoni P., et al., A Comparison of Mesh Simplification Algorithms, Instituto di Elaborazione dell'Informazione, Sep. 25, 1997. pp. 1-29.

Gursoz, E. L., Choi, Y., and Prinz, F. B., Vertex-based Representation of Non-manifold Boundaries, in Geometric Modeling for Product Engineering, M. J. Wozny, J. U. Turner, and K. Preiss, Eds. North-Holland, Amsterdam, The Netherlands, 1990, pp. 107-130.

Hoppe, Hugues, Optimization of Mesh Locality for Transparent Vertex Caching, Proceedings of the 26th Annual Conference on Computer Graphics and interactive Techniques International Conference on Computer Graphics and Interactive Techniques, pp. 269-276, 1999.

Li, H., Middleware for Streaming 3D Progressive Meshes over Lossy Networks, ACM Transactions on Multimedia Computing, Communications and Applications, vol. 2, No. 4, Nov. 2006, pp. 282-317.

Rossignac, J., CSG-BRep Duality and Compression, in Proceedings of the Seventh ACM Symposium on Solid Modeling and Applications (Saarbrücken, Germany, Jun. 17-21, 2002), p. 59.

Sang Hun Lee, Feature-Based Multiresolution Modeling of Solids, ACM Transactions on Graphics, vol. 24, Issue 4 (Oct. 2005), pp. 1417-1441/.

* cited by examiner

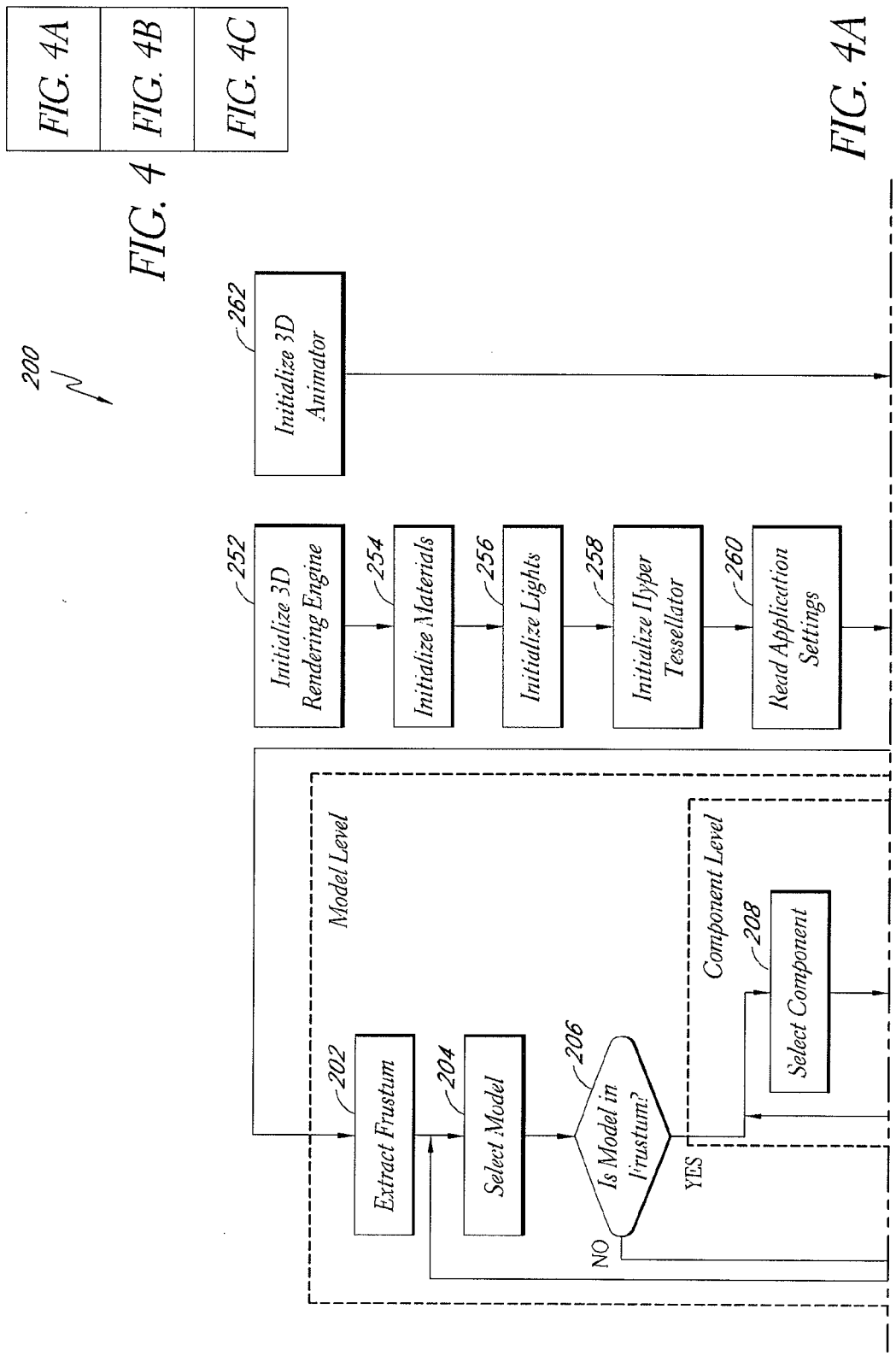

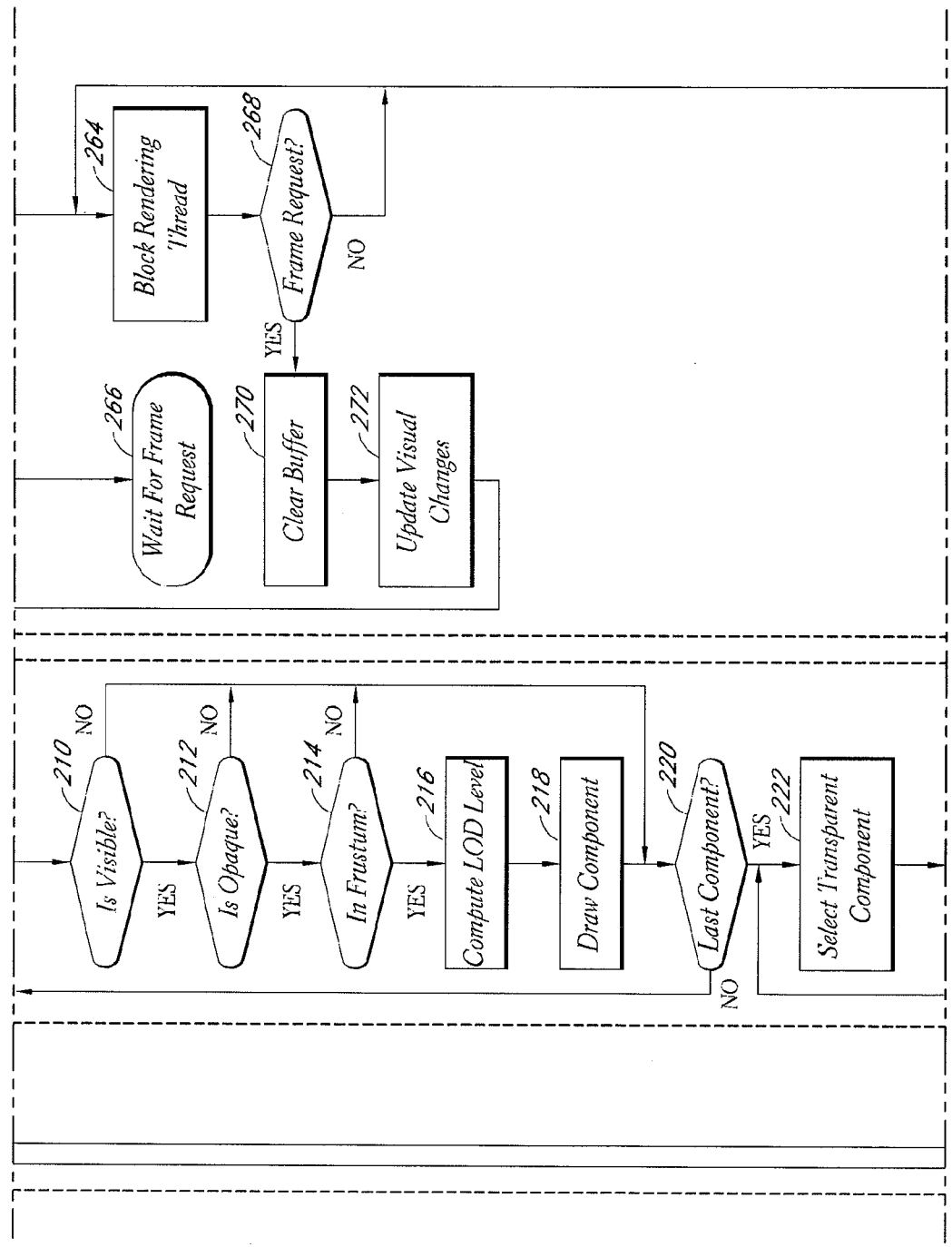

SYSTEM AND METHOD FOR HYBRID SOLID AND SURFACE MODELING FOR COMPUTER-AIDED DESIGN ENVIRONMENTS

CROSS-REFERENCE TO RELATED APPLICATIONS

This application claims priority under 35 U.S.C. §119(e) to U.S. Provisional Application Ser. No. 61/196157, filed Oct. 14, 2008 and U.S. Provisional Application Ser. No. 61/166669, filed Apr. 3, 2009. The disclosures of these applications are all hereby incorporated by reference in their entirety herein.

BACKGROUND OF THE INVENTION

1. Field

This application relates generally to computer-aided design (CAD), and more specifically, to methods of modeling environments and objects.

2. Background

Over the last several decades, there have been significant advances in model acquisition and computer-aided design (CAD). These technologies have resulted in the ability to process massive data sets of complex geometric models which include complex CAD environments. These massive data sets typically require large memory size to store the data sets. Handling such massive models presents challenges to software and system developers. This is particularly true for highly interactive 3D applications, such as visual simulations and virtual environments, which need to provide interactivity, low-latency, and real-time processing. A significant problem is in the post design phase of CAD projects where a collection of data is required to be viewed at once in an interactive mode. The amount of data to be loaded is usually large and is usually transformed into triangular meshes which are optimized for processing over the graphics processing unit (GPU). This technique will generate information that is required to draw these objects, but will lose features of the original design topology and various capabilities.

Previous systems and methods focused on triangulated mesh modeling since a triangle is the simplex of the graphic pipeline. This methodology removes capabilities of original CAD designs. For example, objects in the original CAD design are more editable and analyzable than their triangulated mesh modeling counterparts. Therefore, a need exists to model CAD designs so as to reduce the size of memory necessary to store structures that are highly editable and analyzable, while also being able to render the environments quickly and efficiently.

SUMMARY OF THE INVENTION

One embodiment provides for a computer-aided design (CAD) system, comprising an electronic device comprising a processor. The processor comprises a first module configured to represent computer-aided design objects in a virtual environment using two types of objects. A first of the two types of objects comprises a plurality of sections defining a shape of an object for rendering. Each section that defines the shape of the object for rendering is configurably defined as one of a complex surface, a complex polygon, a polygon, or an array of triangles or quads. A single section of the plurality of sections is capable of being any one of the complex surface, the complex polygon, a polygon, or the array of triangles or quads. The first type of object comprises information defining collective characteristics of the plurality of sections, and information interconnecting at least two neighboring sections of the plurality of sections. A second of the two types of objects stores information referencing a common object in the virtual environment and one or more transformations for at least a section of the common object. A second module configured to render the computer-aided design objects in three dimensions.

One embodiment provides for a method of rendering three dimensional shapes on an electronic device. This method comprises selecting computer-aided design objects. The computer-aided design objects comprise two types of objects. A first of the two types of objects comprises a plurality of sections defining a shape of an object for rendering. Each section defining the shape of the object for rendering is configurably defined as one of a complex surface, a complex polygon, a polygon, or an array of triangles or quads. A single section of the plurality of sections is capable of being any one of the complex surface, the complex polygon, the polygon, or the array of triangles or quads. The first of type of object comprises information defining collective characteristics of the plurality of sections, and information interconnecting at least two neighboring sections of the plurality of sections. The second type of object comprises information referencing a common object in the virtual environment and one or more transformations for at least a section of the common object. This method also comprises drawing at least one section of one of the two types of objects in a virtual environment.

Another embodiment provides for a computer-aided design system comprising an electronic device comprising a processor. The processor comprises means for representing computer-aided design objects in a virtual environment using two types of objects. The first type of objects comprises means for modeling a plurality of sections defining a shape of an object for rendering, each section defining the shape of the object for rendering being configurably defined as one of a complex surface, a complex polygon, a polygon, or an array of triangles or quads. A single section of the plurality of sections is capable of being any one of the complex surface, the complex polygon, a polygon, or the array of triangles or quads. The first type of object also comprises means for storing information defining collective characteristics of the plurality of sections. The first type of object also comprises means for storing information interconnecting at least two neighboring sections of the plurality of sections. The second type of object comprises means for storing information referencing a common object in the virtual environment. The second type of object also comprises means for performing at least one transformation on at least a section of the common object. The processor also comprises means for rendering the computer-aided design objects in three dimensions.

For purposes of summarizing the invention and the advantages achieved over the prior art, certain goals and advantages of the invention have been described above and as further described below. Of course, it is to be understood that not necessarily all such goals or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to

BRIEF DESCRIPTION OF THE FIGURES

FIG. 4, which includes FIGS. 4A-4C, is a flowchart illustrating an embodiment of a method for rendering 3D objects represented by the structure of FIG. 3.

DETAILED DESCRIPTION

Figure 1:
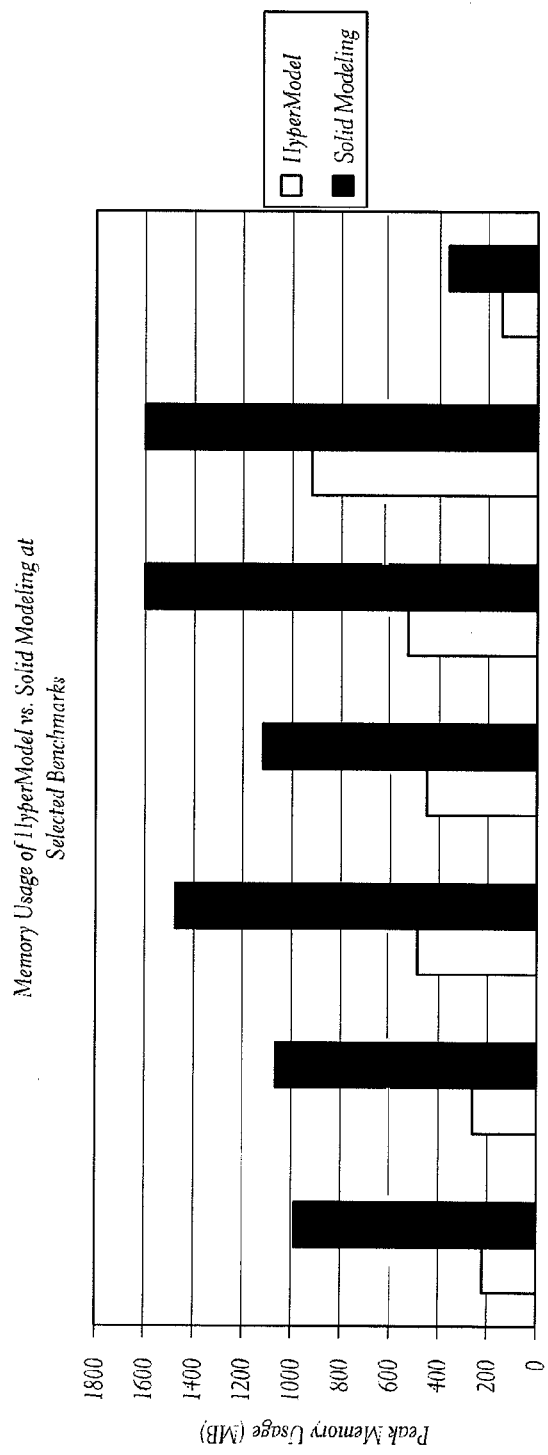
FIG. 1 is a chart illustrating peak memory usage in hyper models compared to peak memory usage in solid modeling on load.

The following detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Overview

Computer-aided design (CAD) is used in the design and drafting of objects. It is both a visual and symbol-based method of communication. Solid modeling is a modeling method that uses combinations of representations of solid objects such as cylinders, spheres, etc., to model 3D objects. Surface modeling is a modeling method that uses representations of surface forms to model 3D objects. Solid modelers are usually referred to as parametric feature based modelers. These modelers can be either a constructive solid geometry (CSG) or a boundary representation (B-REP) modeler that allows a user to refer to features instead of the underlying geometry of objects. A feature is a term referring to higher order CAD entities. For example, given a 3D wall with a hole, the hole is considered a feature in the wall to reflect the manufacturing process used to create it, rather than referring to the hole by the mathematical term cylinder. Parametric feature based modelers track states of the objects to maintain information about building the model and use expressions to constrain associations between the geometric entities. This allows a user to make modifications in any state and to regenerate the model's boundary representation based on those changes. Surface modeling refers to the use of geometric entities and simplexes to represent the surface of objects without information about features or a constructability procedure.

In some aspects, methods and systems are provided herein that are a hybrid solution between solid modeling and surface modeling. The methods and systems are directed to structures that represent objects and rendering of the objects. The hybrid solution is herein referred to as a "hyper model." Hyper models combine the modeling features and rules of solid modeling and the performance abilities provided by surface modeling. Herein, the capabilities of the hyper model are explained, as well as the dynamic structure and dynamic rendering of the hyper model. Further, a distance level of detail (DLOD) scheme used with the hyper model is explained.

In some embodiments, hyper model structures representative of a virtual environment are rendered by processes described herein. The structures may be stored in the memory of a computing system. The processes may be carried out by a processor, which has access to the stored memory of the computing system. The processor may then render the virtual environment for display to a user. For example, model data may be transformed to a format suitable for rendering in a standard graphic API such as OpenGL. The rendering engine then renders the virtual environment and sends it to the display using the graphic hardware.

Conventional structures use triangulation for storing geometric data relating to models. The triangulation data leads to hardware acceleration because in any model, all polygons will be transformed to triangles to be rendered by a graphics card. Though storing triangulation data increases rendering speed, it also increases the amount of memory required to store each of the triangles. The hyper model provides a memory efficient method of storing data structures, while still providing flexibility and fast rendering speeds.

Hyper models are a hybrid solution between solid modeling and surface modeling. Hyper models are made up of one or more hyper component objects. These hyper component objects provide the capabilities of solid models, with the efficiency of surface models and subdivision models. The hyper component object has many of the features of a typical solid modeler design, but without the need for a creation track.

The creation track of a solid is one of the main methods of saving a solid object. Typically, a creation track comprises a sequence of operations and combinations of extrude, revolve, sweeping, and Boolean operators. Saving this sequence of commands and associated parameters is memory consuming if the final object viewed is the solid object at the final stage. Moreover, the computation of the final object requires significant processing, even using the most advanced techniques. The end result of the creation of the solids has a set of capabilities that are useful for more detailed understanding of the CAD object and for processing it. These capabilities are considerations that make solid modeling such a common tool for modeling and processing in the CAD industry.

Two of these capabilities are edit-ability and accuracy. Edit-ability comprises the capability of being able to change the final shape from any stage of the creation track. Accuracy results from saving the creation sequence instead of the final vertices, which are float values known to be inaccurate. Accuracy is advantageous for CAD objects since the final result is usually transferred to fabrication.

The hyper model preserves both capabilities by allowing editing of the object where editing is needed. For example, a window hole in a wall could be edited separately from the wall. The wall and the hole are considered separate entities in the hyper model, which are combined by the hyper renderer. The accuracy is kept in the hyper model since the connectivity of the object is saved in the component and element levels. The values of the connectivity are saved in a relative manner (parametrically). The hyper component object stores enough information to render the object shape similar to the original drawing. The hyper component object is efficient in the sense that it requires little memory use as compared to solid modeling based objects and surface modeling based objects.

For example, the memory usage of the hyper model with respect to the solid model was benchmarked under the same environment and system using the same model set for both. FIG. 1 illustrates a comparison of the peak memory usage of both methods for loading the same model shape. Each two consecutive bars represent one model used. The y-axis represents the peak memory usage in megabytes (MB). The dark columns represent solid modeling, and the light bars represent using hyper models. In this example the hyper model uses at most half of the memory needed by a solid modeler to load the same objects. While the solid model preserves all states and the track of the creation process, this process is memory consuming and reaches its peak on creation.

Solid modeling based objects contain much data pertaining to the features and the construction process and history of the objects. Surface modeling based objects contain many triangulations and polygons, which is known to require a lot of memory for storing objects but achieves high performance when using the capabilities of modern hardware.

A hyper component object removes both the history and complexity of solid modeling representation. At the same time, a hyper component object also removes the dense, high polygon count of surface modeling. The hyper model allows a single object to be represented in different forms and modes, such as a reduced form and a semi-B-REP look. The semi-B-REP look comes from the structure of the hyper model and the structure of the underlying hyper component objects. The reduced form is provided by reducing the resolution level of the object and minimizing the details needed by the rendering engine to enhance performance. Any object in the hyper model can be reduced to a single polyline representation, which represents the medial axis that defines the object. The hyper model also provides a user with an interface similar to traditional CAD design, but in a form optimized for visualization. Therefore, the hyper model provides the ability to change the details of an object beyond what is available when the model is stored as a collection of triangles. Further, the hyper model has a smaller memory footprint than traditional CAD objects.

Model Capabilities

Figure 2A:
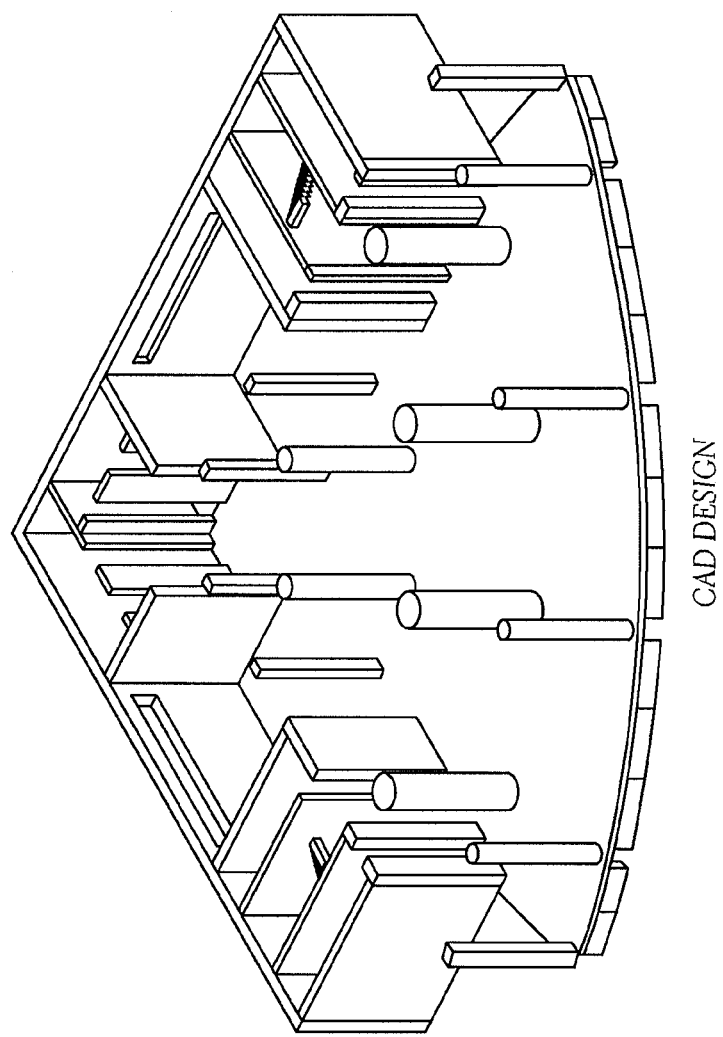
FIG. 2A is a model of a design using a traditional CAD tool.

CAD design has many features. The features of CAD design arise from drafting methods used in construction of the various shapes of a model. For example, a floor of a building, as shown in FIG. 2A, is designed using a single outline for the contour shape. This contour describes the cement slab that will be made during the construction phase. The shape of this floor is preserved using design methods and systems described herein, as shown in FIG. 2C. This enables a user to visually identify the slab. The methods and systems described herein also have the capability to cut such a polygon into smaller shapes. For example, the cement slab may be divided into smaller shapes. These smaller shapes may show the individual shapes that may be made as part of the overall construction of the cement slab. The division of construction into the smaller shapes may be necessary because construction of the entire floor as a single step is not possible in most cases.

Figure 2B:
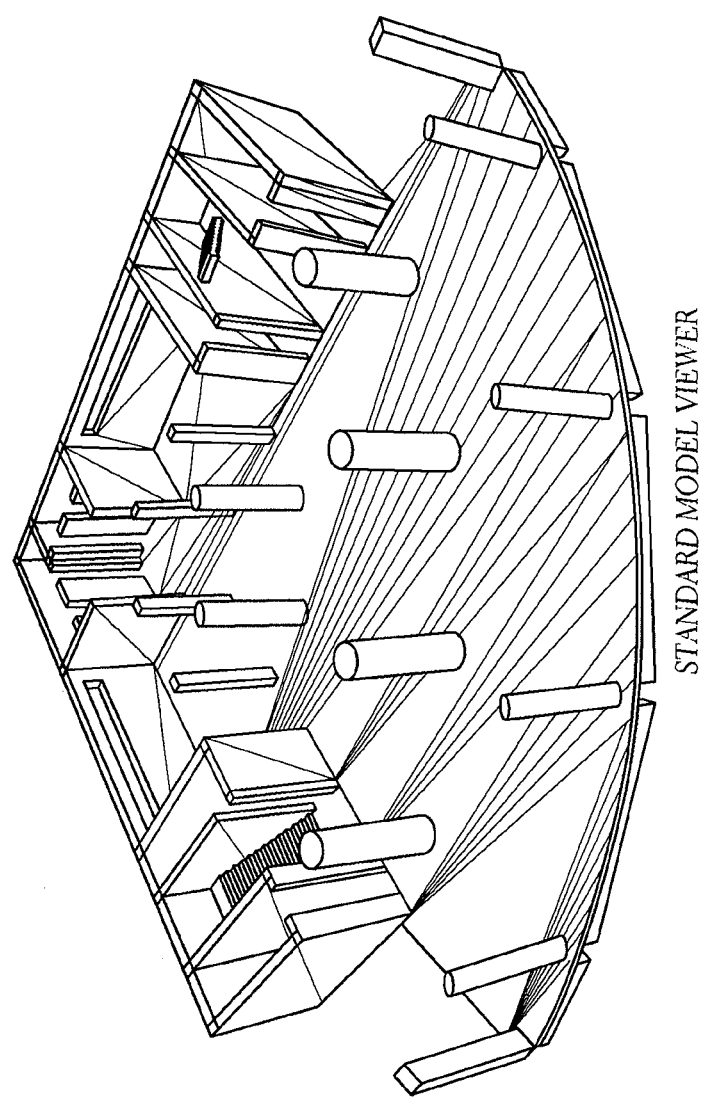
FIG. 2B shows the model of FIG. 2A as seen in a standard post design viewer.
Figure 2C:
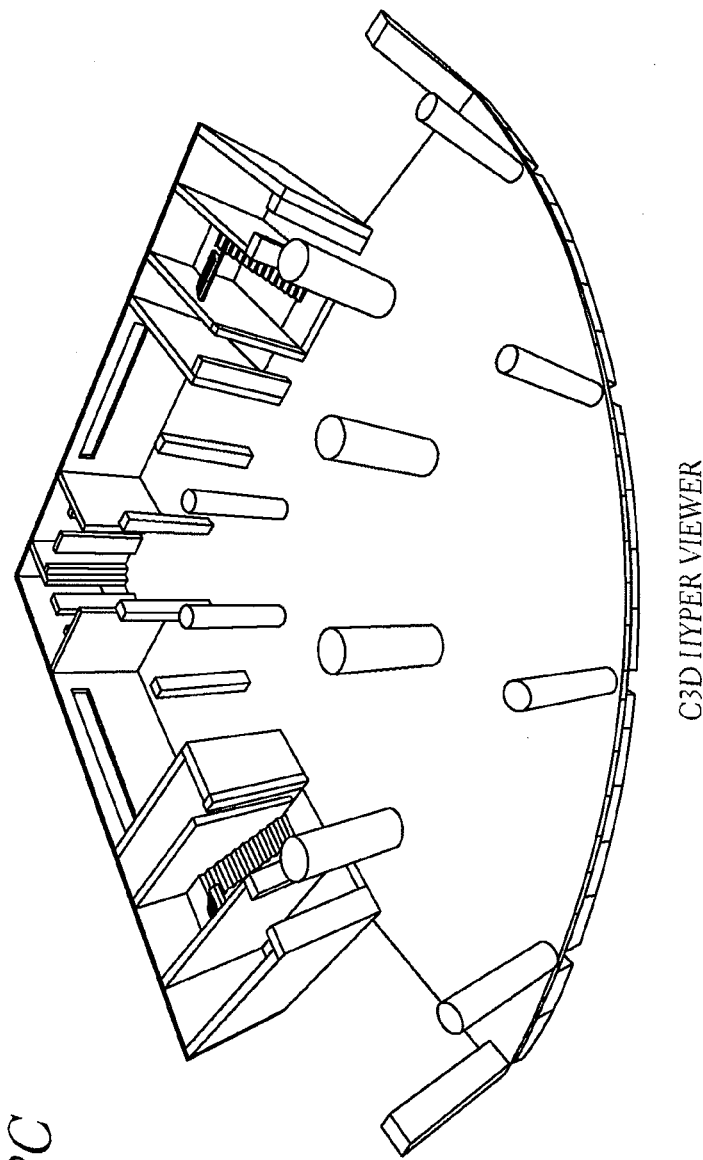
FIG. 2C shows the model of FIG. 2A in hyper model construction.

The capability to divide polygons into smaller shapes is lost when modeling using triangulated data as shown in FIG. 2B. This is because the original contours are difficult to identify. Further, methods and systems described herein preserve features, such as holes, at the data level, so revisions and comments can be made visually by changing the position of the feature. The similarity of the methods and systems described herein to traditional CAD design allows for the system to be used not just as a model viewer, but also as an interactive reviewer.

FIG. 2A is a model of a floor designed using a traditional CAD tool. All of the objects are modeled as B-REPS and concave objects. A concave polygon is defined as a polygon with one or more interior angles greater than 180°. In contrast, a convex polygon is defined as a polygon with every internal angle less than 180° and every line segment between two vertices remaining inside or on the boundary of the polygon. Concave polygons are modeled as a single "hyper polygon" in the hyper model. A hyper polygon of the hyper model allows the representation of both concave and convex polygons and any set of combinations between them, including features such as holes. The hyper polygon can also represent non-planar polygons. The hyper polygon describes a high level polygon that combines all the shapes of simple polygons, such as triangles, and complex polygons. Complex polygons include concave polygons, non-planar polygons, and polygons with features like holes. The hyper model is also capable of modeling complex surfaces, which include non-planar surfaces and surfaces comprising features of another object such as a hole. Thus, a hyper model can represent sections of an object for rendering as a complex surface, a complex polygon, a polygon, or an array of triangles or quads. Typically, sections represented as a polygon are represented in a polygon array. Further each segment is capable of being any of a complex surface, a complex polygon, a polygon, or an array of triangles or quads.

In FIG. 2B, the same model is seen in a standard post design viewer, where all the objects have been tessellated into triangles. The details of FIG. 2A, such as objects having solid features, such as holes, and concave polygons are lost in FIG. 2B. In FIG. 2C, the same model is seen as a hyper model construction. In this model, holes and large polygons are preserved. The hyper model keeps the important properties of the CAD model while reducing the memory space required to store the model. In some embodiments, the hyper model includes all of the modeling abilities of a solid object and all the properties of a subdivision surface.

The hyper model is feature based to some extent. The features represented in the hyper model are based on the object represented and whether such features will benefit from the representation of the hyper model. This decision is made when the hyper model is created from the CSG or B-REP data. The hyper model can also be viewed at many detail levels. The detail levels include component bounding box, element bounding box, element reduced form (medial axis), and component reduced form (basic shape). The component bounding box is the high level axis aligned bounding box (AABB), defined by the maximum and minimum coordinates, or the marching bounding box (MBB), which defines the minimum fitted box on the object. The element bounding box is also an AABB or MBB, which define the bounding box of the objects contained in the component. The element reduced form is the low level detail describing the object, which can be as simple as the medial axis of the object. The reduced shape of the component is sum of reduced shapes of the elements combined in the objects. These detail levels are controlled by the DLOD scheme. The DLOD will define the detail level needed to view the object on a scene, depending on how far the object is from a view point.

Further, the hyper model recognizes similar objects in a design environment and represents them as replicas of each other. Similar objects are stored as a single object. The object is then transformed using a set of affine transformations to reproduce each of the similar objects. Therefore, a single stored object can represent many objects in the environment, as opposed to storing full structures for each object in memory. Transformations such as scaling, rotating, and translating, can be used.

The hyper model and the corresponding hyper rendering engine are designed to provide a hybrid solution to storing, rendering, and manipulating virtual objects, while allowing the objects to be convertible to either solid models or surface models.

Interoperability

The above described structures allow the hyper model to be created from standard constructive solid geometry (CSG) data used in traditional CAD design. The CSG data is read and mapped to the appropriate objects of the hyper model. The objects are mapped to a component where the elements of the component differ in context and structure. Depending on the original design and data being imported, the importer will process these data and transfer the object to a hyper element. If the imported objects are designed of triangles only, a one to one mapping is performed to because a triangle is a simplex object that contains no other property. The object is then constructed as a hyper model. The hyper model includes all the solids resulting from conversion of the CSG object to the hyper model representation, but not all of the properties of the CSG object as previously described. The hyper generator then combines the object's elements and generates the medial axis and flags the faces, which comprise surfaces that represent a part or side of the object, that have features, such as holes, and the faces that are non-planar. The hyper generator then combines elements of the same type and having the same properties together, saving memory. These properties comprise xyz-coordinate sharing, shape sharing, and feature shape sharing. The hyper generator which works on import after the hyper model is created. If elements of the same component share vertex coordinates, these coordinates can be combined and referenced by the objects. If two elements of the same component have a similar feature, like a reform hole, the feature can be saved and referenced from both elements with affine transformation information. This option reduces memory usage and helps speed up the rendering of the objects since the shape data is transferred to the graphic memory once for both objects, instead of two times.

The mapping process is also reversible. Hyper model objects can be converted back to CSG data. The CSG data is linked as a property for each element to allow such reversibility. The linking is achieved by defining the original model file of the object and the CAD cell ID in the hyper model.

In some embodiments, the hyper model also allows for the hyper model to be created from B-REP data used in traditional CAD design. This capability can be implemented substantially similarly to the interoperability capabilities of CSG data.

In some embodiments, the hyper model also allows for a one to one mapping of triangulated data to objects in the hyper model as the triangle polygons are treated as simple polygons. The faces of the hyper model are triangulated in these embodiments.

A skilled artisan will appreciate that other data representations used in solid modeling and surface modeling not explicitly referenced above can also interface with the hyper model substantially similarly to create the above described interoperability capabilities.

Dynamic Structure

The hyper model uses a dynamic structure for storing objects. The objects have a small memory footprint and can be dynamically viewed. The object can be viewed by its rendered shape, its approximate shape, its medial axis, and/or its bounding box. Each object, depending on its shape and properties, may have a list of low resolution functions to represent the object. For example, if an object is a pipe, it gets a cylindrical shape and a reduced shape of a line. The reduced shape of a line is also the medial axis of the object in this example. The reduced shape is computed at render time by the rendering procedure. The objects are partially based on the features and contours of the objects. By reducing the detail level of the contour, the renderer produces a reduced form of the shape. This reduction in details may be accomplished by omitting some vertices from the original contour.

During the rendering of a frame which may have many objects, each object determines the representation it will draw depending on the view mode, frame rate, and/or occlusions. For each frame, the rendering engine reads the view mode, the previous frame rates, and/or the occlusion tree that was generated from the first pass rendering loop. In some embodiments, the building of the occlusion tree is optional. The occlusion tree is built by first assigning the nearest set of objects to the viewpoint as the root object and the major occluders of the scene. Then the "children" of the tree are computed by a distance function from the root node and the pixel count generated from the first pass of the rendering loop. The pixel count is useful in this case because when an object is far from the view point in a 3D scene the object will appear small, which will produce a lower pixel count than when it is near. This distance function divides the scene into regions and each region is assigned a level in the tree.

Each view mode requires a different rendering state and results in a different load level on the rendering pipeline. The view mode, chosen by the user, describes the rendering option and type, which include fully shaded, wireframe, shaded wireframe, hidden line, reduced form, and illustration. These view modes require different materials colors and lighting options which define the rendering state in general. The total number of objects to be drawn is based on the desired frame rate. The number of objects drawn is chosen so the actual frame rate is approximately near the desired frame rate. The desired frame rate may be predefined.

The occlusion tree is used to determine which objects do not need to be rendered. In embodiments without the occlusion tree, the rendering engine may remove small objects that are not near the viewpoint within the environment. The viewpoint is the virtual location in the environment from which a user views the objects in the environment. Therefore objects are rendered as viewed from the perspective of the viewpoint.

The structure of the hyper model includes a three level hierarchy. The model level is the root level wherein all rendering decisions are made according to the current factors and properties of the rendering engine. An exemplary rendering engine is illustrated in more detail in FIG. 4. The model level can comprise computer aided design objects, which may be used to render shapes in a virtual environment. The second level is the component level. A hyper model includes one or more components. These components can comprise objects called component objects. Computer aided design objects may comprise component objects. The hyper model sets the rendering priorities of the components of the components according to the relative component status to the camera, view mode and frustum of the frame to be rendered. These options and states are retrieved from the rendering engine at the start of the rendering process. The camera position is used to setup the scene lights and initialize the DLOD. The frustum also sets the DLOD limits.

The DLOD is measured as a function of pixel count, distance from a view point and importance to a model general look. The importance to the general model look parameter ensures that portions of an object that are visible from a bird's eye view of the virtual environment are not hidden. For example, if an object is visible from the bird's eye view of the virtual environment, but occluded from a view point, the importance to the general model look parameter is used to preserve a low detail level. This allows the object to be visible form the bird's eye view at a low level of detail, even though it is not visible from the view point.

DLOD is used to define the detail level of the hyper model and determine at which quality to render the hyper model. For example, a DLOD may be used to set the detail level to component bounding box. In another example, DLOD may be used to set the detail level to component reduced form. Comparing these two examples, an object with a component bounding box detail level will render an object of higher quality than an object with a component reduced form detail level.

The DLOD is used to decide a form in which an object will be rendered. An example of this is rendering a pipe that is far from a view point. Since it is far from the viewpoint, the pipe will appear on the scene as a line. Thus drawing a line, which in this case is equivalent to the medial axis, is sufficient to show the details of the model. This example also corresponds to the element reduced form detail level. In embodiments where an occlusion tree is included, the frustum is used to set the region of the tree containing objects that will be examined for rendering. All objects outside of the current frustum are not rendered. Based on the view mode, the type of materials that are needed and the properties of each material are selected.

The component level is the lowest level that a user interacts with. The third level is the object level. Each component includes one or more objects. The objects contain graphics data. These objects may also be referred to herein as elements or element objects. The component sets the rendering priorities and the type of rendering to be used for each object depending on the factors calculated at the model level. The objects then draw themselves according to type and the requested quality set by components, as shown in FIG. 4.

Object Hierarchy

As discussed above, the hyper model is based on a hierarchy of objects. The hyper model includes a hash map of components, where each component is placed with its ID as the key for retrieval of the components as the user interacts with the components. The components each have an array of hyper objects. A hyper object is the abstract level of the elements of the components. Two types of hyper objects are hyper mesh objects and hyper reuse objects.

Hyper mesh objects may represent CSG objects. Hyper reuse objects represent certain objects that are modeled one time and then reused in the system. These objects are represented by a unit object, which includes the geometry data and topology of the element. If a new shape is desired based on a stored unit object, a set of affine transformations are applied to the stored unit shape and the unitized geometric data to create the shape. The hyper reuse objects, therefore, may store a unit object ID which points to the unit object, a transformation matrix including scaling, rotation, and translation factors, and the element position. Rendering of the hyper reuse objects is done by accessing the unit object and applying the transforms and positioning the object. Since only a pointer to the unit object is stored in each hyper reuse object, multiple objects can be represented by one stored unit object, reducing memory needed for storage. For example, if a scene has many cylinders, a single unit object can be stored, and a hyper reuse object can be created for each cylinder that indicates how to render the unit object to create the individual cylinders.

Figure 3:
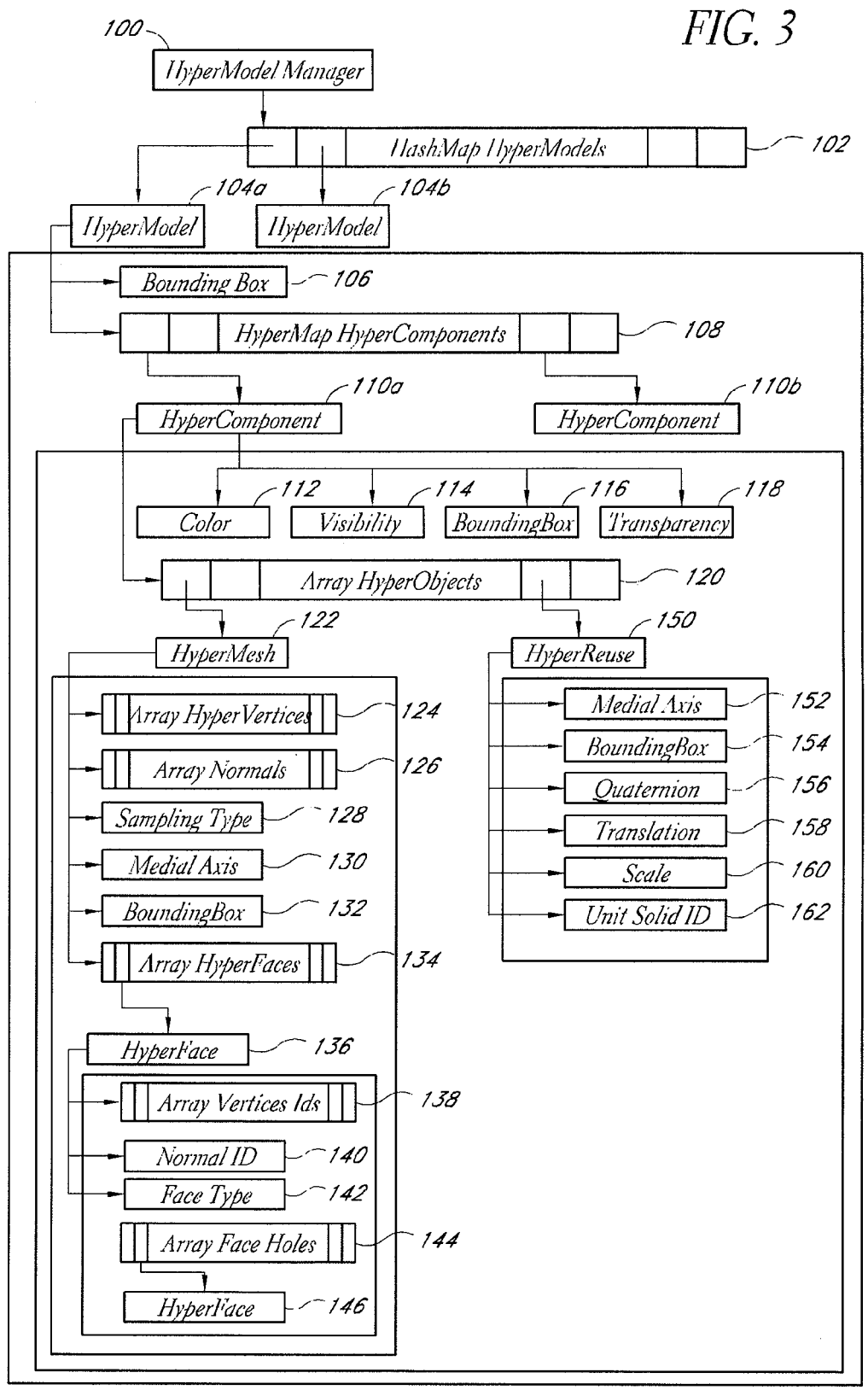
FIG. 3 is a block diagram illustrating an embodiment of a structure for representing 3D objects.

FIG. 3 is a block diagram illustrating an embodiment of a structure for representing 3D objects. Hyper model manager 100 organizes storage of hyper models 104 in hyper model hash map 102. Hyper models 104 represent computer aided design objects. The hash function of the hyper model hash map 102 can be any function desired since the retrieval of the value is understood to be atomic in most cases. For a hyper model 104, a trivial hash function may be useful since typically the number of components in the model is known in advance. Hyper model hash map 102 provides for storage and accessibility of hyper models 104. The hyper model manager 100 links other portions of the application to the hyper models. The manager propagates all the queries that are made by the application to the hyper component objects 110. Hyper models 104 are a dynamic structure for storing 3D objects. Hyper models 104 allow the 3D objects to be viewed by their rendered shape, approximate shape, or medial axis and bounding box.

The structure of Hyper Model 104a is further detailed in FIG. 3. The hierarchy of the hyper model 104 comprises 3 levels: the model level, the component level, and the object level. Hyper Model 104a includes a hyper model bounding box module 106 and a hyper component hash map 108 of hyper component objects 110. Hyper model bounding box module 106 includes information that defines the bounds of hyper model 104a. Hyper component hash map 108 allows for storage and access of hyper component objects 110.

A hyper model 104 comprises one or more hyper component objects 110. Hyper component object 110a includes information about the component in color module 112, visibility module 114, hyper component bounding box module 116, and transparency module 118. For example, color module 112 may comprise information related to material colors and shading. For example, visibility module 114 may comprise a set of Boolean values, which can be used to determine whether a hyper component object 110 is visible or not. For example, if the hyper component object 110 is occluded, an occlusion tree can update visibility information in visibility module 114. For example, hyper component bounding box module 116 may comprise information defining the outer bounds of the hyper component object 110a. For example, transparency module 118 may comprise a float value ranging between zero and one, where one is fully transparent and zero is fully opaque. Each component also includes a hyper object array 120, which stores hyper objects. Each hyper component object 110 comprises one or more hyper object arrays 120. Hyper object array 120 may comprise two types of objects, a hyper mesh object 122 and a hyper reuse object 150. These objects may also be referred to generically as element objects.

Hyper mesh object 122 is an example of a hyper object stored in hyper object array 120. Hyper mesh object 122 comprises an array of hyper vertices objects 124, array of normal objects 126, sampling type module 128, hyper mesh medial axis module 130, hyper mesh bounding box module 132, and an array of hyper faces 134. The array of hyper faces 134 stores one or more hyper face 136. The hyper vertices are objects defining a vertex containing the spatial coordinates, a unique identifier, and the list of faces (ids) adjacent to this vertex. Hyper face 136 describes a surface that represents a part or side of an object. The sampling type module 128 defines the minimum reduced shape of hyper mesh object 122, which can be a bounding box or medial axis, defined by an integer value. Sampling type module 128 may store information relating to detail levels that are described above.

Hyper face 136 comprises an array of vertices IDs 138, a normal ID module 140, a face type module 142, and an array of face holes 144. The array of vertices IDs 138 identifies vertices of the hyper face 136. The normal ID module 140 identifies normals of hyper face 136. The array of face holes 144 comprises one or more hyper faces 146. Exemplary face type modules 142 include polygons, complex polygons (which may contain holes), surfaces (which may contain holes), triangles, quads, quad strips and triangle strips. Hyper faces 146 are included in the associated face since they are regarded as features of this face. However, a skilled artisan will appreciate that it would be possible to have the array of face holes 144 point to hyper faces that are not included in the associated face.

Thus, a hyper mesh object 122 can represent sections of an object for rendering as a complex surface, a complex polygon, a polygon, or an array of triangles or quads. Typically, sections represented as a polygon are represented in a polygon array. Further each segment is capable of being any of a complex surface, a complex polygon, a polygon, or an array of triangles or quads. A skilled artisan will appreciate that only segments that comprise complex polygons and complex surfaces use the array of face holes 144 and hyper faces 146 in rendering an object.

Hyper reuse object 150 is another example of a hyper object stored in hyper object array 120. Hyper reuse object 150 includes hyper reuse medial axis module 152, hyper reuse bounding box module 154, quaternion module 156, translation module 158, scale module 160, and unit solid ID module 162.

The hyper reuse object 150 by its design improves rendering speed since only one common object is typically transferred to graphic memory while rendering, and all of the objects that comprise reuses are generated from affine transformations on the common object. The common object may comprise a common shape. At least a section of the common shape may be transformed one or more times in a virtual environment, and then drawn as a new shape that is similar to the common shape. The reuse also saves memory since the reuse object saves only the common object, instead of storing an object for each use of the reuse object. An example of a reuse object can be a unit cylinder, which can be used to render all the pipes and columns in a scene with transformations.

In FIG. 3, the reused object is a unit solid ID. Unit solid ID module 162 comprises information referencing an object that is used more than once in rendering. In some embodiments unit solid ID module 162 comprises a hyper mesh object 122. In some embodiments, unit solid ID module 162 comprises a portion of a hyper mesh object 122.

Translation module 158 comprises information related to a translation of a unit solid ID. For example, it can comprise information relating to the translation of an affine transformation. Quaternion module 156 comprises information regarding rotation and orientation of a hyper reuse object 150. Scale module comprises information related to scaling a unit solid ID. For example, it can comprise information relating to the scale of an affine transformation.

Figure 7:
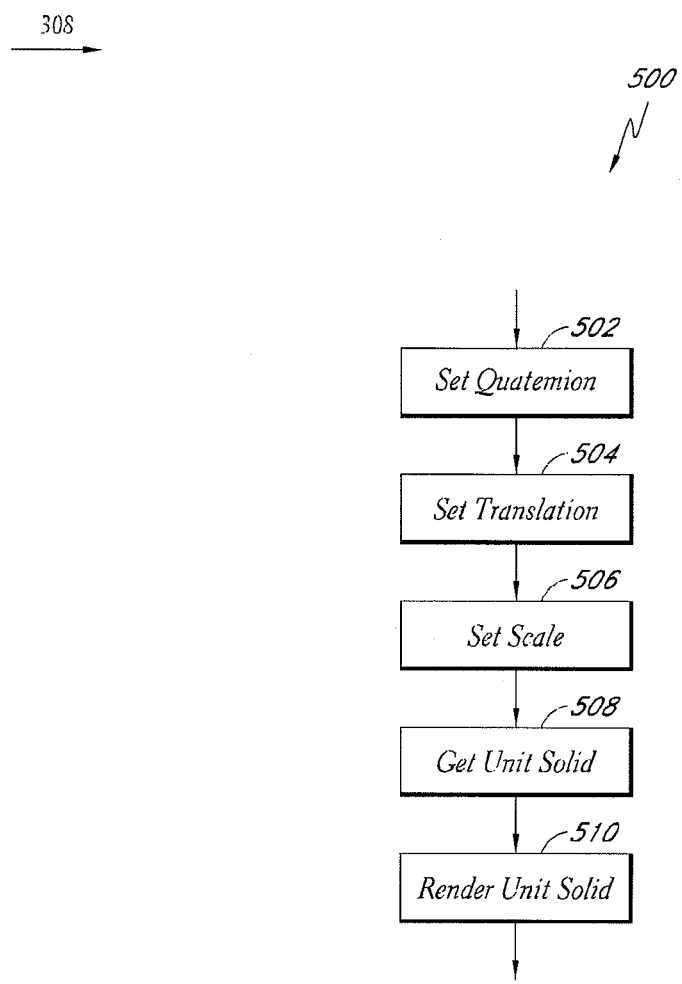
FIG. 7 is a flowchart illustrating an embodiment of rendering a hyper reuse object.

Thus, affine transformations can use translation module 158, quaternion module 156, and scale module 160 to render objects from unit solid ID module 160. This process is illustrated in FIG. 7.

Hyper model manager 100 of FIG. 3 is comprised of various modules, including modules 106, 112-118, 128-132, 140-142, and 152-162. As can be appreciated by one of ordinary skill in the art, each of the modules 106, 112-118, 128-132, 140-142, and 152-162 comprise various sub-routines, procedures, definitional statements, and macros. Each of the modules 106, 112-118, 128-132, 140-142, and 152-162 are typically separately compiled and linked into a single executable program. Therefore, the following description of each of the modules 106, 112-118, 128-132, 140-142, and 152-162 is used for convenience to describe the functionality of the hyper model manager 100. Thus, the processes that are undergone by each of the modules 106, 112-118, 128-132, 140-142, and 152-162 may be arbitrarily redistributed to one of the other modules, combined together in a single module, or made available in a shareable dynamic link library. Further each of the modules 106, 112-118, 128-132, 140-142, and 152-162 could be implemented in hardware.

Dynamic Rendering

Since the elements of the hyper model may comprise a combination of solid objects and surface objects, an appropriate dynamic rendering scheme is provided to render the objects. Accordingly, a hyper model 104 from FIG. 3 may be configured to be updated dynamically. Some objects need to be triangulated before they are sent to the rendering pipeline. The rendering engine triangulates these polygons that are non-planar and/or convex on the fly, as individual frames are rendered.

Since not all objects are visible in a frame, all objects are not triangulated for each frame. The rendering engine may include a buffer of fixed or variable size that is used to store triangulated faces and vertices that are generated for rendering the surface of a solid object. For example, the buffer is used when a polygon includes a feature, such as a hole. The on-the-fly triangulation is combined with osculation tests and DLOD to minimize the number of triangles generated to keep the frame rate high and memory usage low.

Further, the hyper model rendering engine, one example of which is described in further detail in FIG. 4, may group common properties like transparency and material to speed up the pre-rendering process. The grouping may be done at the component level. This grouping speeds up the rendering process since no duplicate property is required to be set at the graphics card, such as transparency factor, material properties, and colors.

Figure 4C:
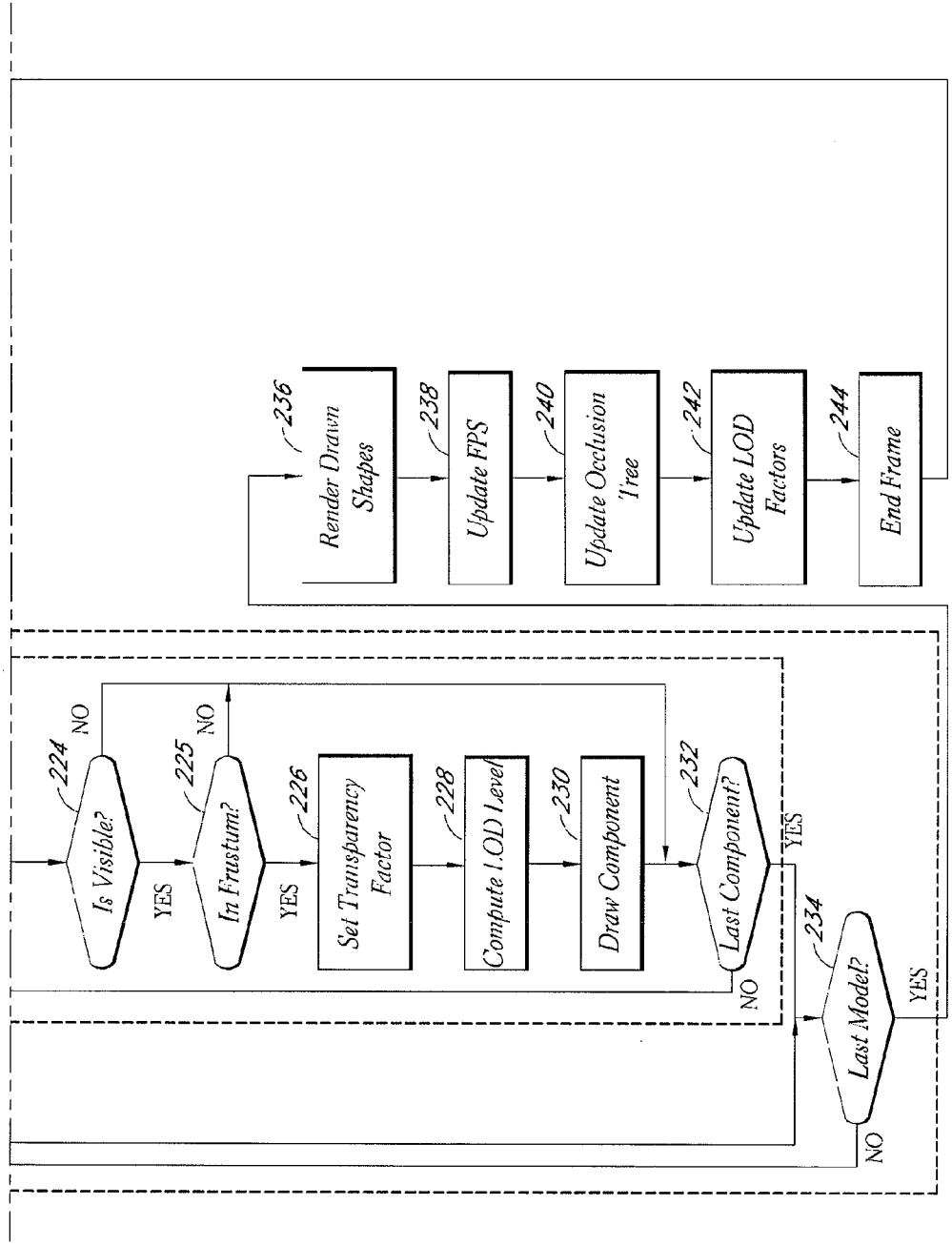

FIG. 4, which includes FIGS. 4A-4C, is a flowchart illustrating an embodiment of a process 200 for rendering 3D objects in a scene in virtual space represented by the structure of FIG. 3 for viewing by a user on a screen, such as a computer monitor. During initialization of the process, two threads are initialized, a 3D rendering engine thread and a 3D animation thread. These threads are used in the rendering process. At step 252, the 3D rendering engine thread is initialized. Continuing, at step 254 the materials are initialized and the common material properties are set. Common material properties include diffuse color, ambient color and specular color of the objects. The values of these properties depend on the color assigned to the object. At step 256, the lights used in the 3D environment are set. At step 258 the helper object that tessellates the hyper polygons is initialized. Further, at step 260, settings ranging from background color to scene options are read from memory and set based on the application settings that are set by the user. The 3D rendering engine thread then "pauses" at step 266 waiting for a request to render a frame of a hyper model. The "pausing" of the thread, in some embodiments, occurs due to the 3D rendering engine thread being blocked from continuing by a 3D animator thread.

At step 262 the 3D animator is initialized. In some embodiments, the 3D animator thread and the 3D rendering engine thread are initialized at substantially the same time. In other embodiments, one thread is initialized before the other thread. The 3D animator handles all incoming requests for a new rendered frame of the model. Examples of applications that request frames are navigation tools provided by the application and all interactive update options provided. Further, at step 264 the 3D animator thread blocks the 3D rendering engine thread from continuing. Continuing, at step 268 it is determined if a frame is requested for rendering. If no frame is requested, the system returns to step 264, where the 3D rendering engine continues to be blocked by the 3D animator thread until a frame is requested to be rendered. If a frame is requested, the process continues to step 270 where the frame buffer is cleared. At a next step 272, visual changes are updated. For example, at step 272 the background color, light color, and/or clip planes for the scene to be rendered may be updated before the models are rendered within the scene based on the user settings. The process continues to step 202, where the hyper model manager is called for rendering of models within the scene of the frame.

The rendering of models in the frame starts at a step 202 where a frustum is extracted. The frustum describes the 3D area that is visible on the screen. At a next step 204, a model is selected from the hash map of hyper models. At a further step 206 it is determined if the selected model is within the frustum. If at step 206 it is determined that the selected model is not in the frustum, the process 200 continues to a step 234.

If at step 206 it is determined the selected model is in the frustum, the process continues to step 208. At step 208, a component of the model is selected. At a further step 210, it is determined whether the component is visible to the user. In some embodiments, visibility can be determined by performing a Boolean operation on the data in the visibility module 114 of FIG. 3. If it is determined that the selected component is not visible to the user, the process 200 continues to a step 220. If it is determined that the selected component is visible to the user, the process 200 continues to a step 212.

At a next step 212 it is determined if the component is opaque. In some embodiments, whether an object is opaque can be determined by comparing a float value stored in the transparency module 118 of FIG. 3 to a threshold value. If it is determined the component is opaque, process 200 continues to step 214. If it is determined that the selected component is not opaque, the process 200 continues to a step 220.

At a continuing step 214, it is determined if the selected component is in the frustum. In some embodiments, whether an object is in the frustum can be determined by comparing if the boundary of the object stored in the hyper component bounding box module 116 of FIG. 3 is inside of the frustum. If it is determined that the selected component is in the frustum, the process continues to step 216. If it is determined the selected component is not in the frustum, the process continues to step 220.

At step 216, the distance level of detail (DLOD) is computed based on the "distance" the object is from a viewer in virtual 3D space and the occlusion function of this object from the user, which is described above. The DLOD is used to calculate the amount of detail (for example, number of triangles) to use in rendering the object. Continuing at step 218, the component is drawn.

The process continues to step 220 where it is determined if the selected component is the last component of the hyper component hash map 108 from FIG. 3. If it is determined the selected component is not the last component, process 200 returns to step 208 where another component is selected. If it is determined the selected component is the last component, process 200 continues to step 222. At step 222, the next transparent component from the hash map of hyper component objects is selected. This step may use step 212 for selecting the transparent objects.

Continuing at a step 224, it is determined whether the transparent component would be visible to the user when rendered. In some embodiments, visibility could be determined substantially similarly to step 210. If it is determined that the selected transparent component would not be visible, process 200 continues to a step 232. If it is determined that the selected transparent component would be visible, process 200 continues to a step 225. At step 225, it is determined whether the transparent component is within the frustum. In some embodiments, whether the component is within the frustum could be determined substantially similarly to step 214. If it is determined that the selected transparent component is not within the frustum, process 200 continues to a step 232. If it is determined that the selected transparent component is in the frustum, process 200 continues to a step 226.

At step 226, the transparency factor for the selected transparent component is set, which is retrieved from a transparency module. The transparency factor is used to compute an alpha value of the RGBA color of an object, which is used to blend the color of the pixels with the object pixels around it. In some embodiments, the transparency factor can be determined from a float value stored in the transparency module 118 of FIG. 3.

Continuing at step 228, the DLOD is computed for the component as a function of pixel count, distance level and importance to the model general look, as described above. The process 200 then continues to step 232.

At step 232, it is determined whether the selected transparent component is the last transparent component of the hyper component hash map 108 of FIG. 3. If it is determined the selected transparent component is not the last transparent component, process 200 returns to step 222 where another transparent component is selected. If it is determined the selected component is the last transparent component, process 200 continues to step 234.

At step 234, it is determined if the model is the last model in the hash map. If at step 234 it is determined the model is not the last model, process 200 returns to step 204 and selects another model. If at step 234 it is determined the model is the last model, the process continues to step 236. At step 236, the components drawn at steps 218 and 230 are rendered. Continuing at step 238, the frames-per-second (FPS) for the rendering process is updated. Further, at step 240, an occlusion tree is updated based on the arrangement of the objects and determining steps 210, 212, and 224. At a next step 242, the DLOD factors are updated based on steps 216 and 228. At step 244, the frame of hyper models has been rendered and may be stored or transmitted to a display device. The process then returns to step 264, where the 3D animator thread blocks the 3D rendering engine thread, until another frame rendering request is made.

Figure 5:
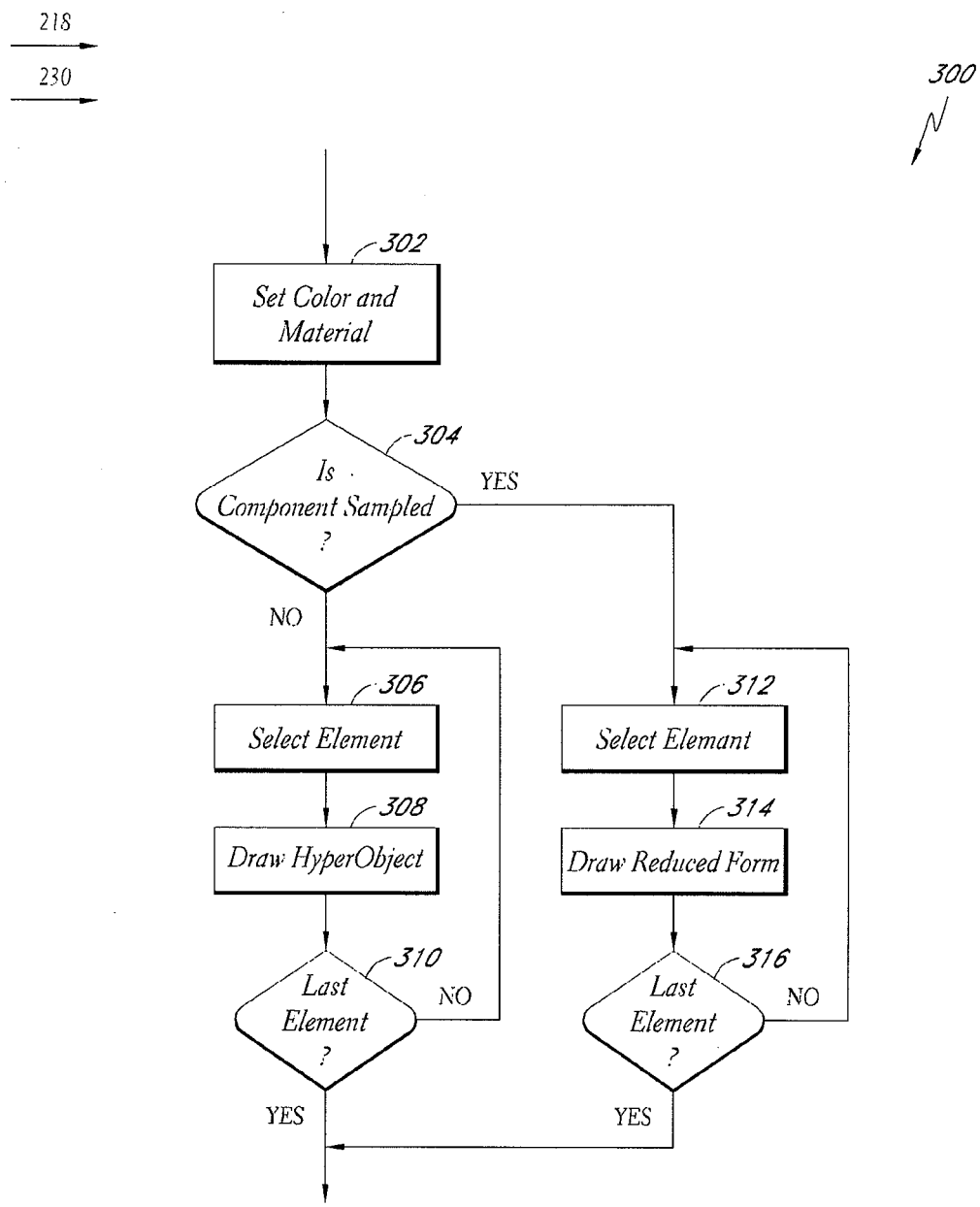
FIG. 5 is a flowchart illustrating an embodiment of a process of drawing components.

FIG. 5 is a flowchart illustrating a process 300 of drawing component objects, also referred to as components. In some embodiments, process 300 corresponds to step 218 and 230 of process 200. At step 302, the color and material for the component are set based on stored settings of a component. Continuing at step 304, it is determined if the component is sampled by retrieving the results from the DLOD computations specific for this component, and according to the sampling type the component is drawn in a reduced form. In some embodiments, sampling type is determined by sampling type module 128 of FIG. 3. If it is determined the component is not sampled, process 300 continues to step 306. At step 306 the next element of the component is selected. Continuing at step 308, the hyper object is drawn. Further, at step 310 it is determined if the selected element is the last element of the component. If it is the last element, in one embodiment process 300 returns to the next step in process 200. If it is determined that the selected element is not the last element, process 300 returns to step 306.

In the alternative, if at step 304 it is determined the component is sampled, process 300 continues to step 312. Drawing sampled objects allows the hyper model to consume less memory and less processor time by using fewer vertices to draw an object. Sampling may be useful in a drawing a variety of objects, including objects with low DLODs and occluded objects. At step 312 the next element of the component is selected. Continuing at step 314, the element is drawn in reduced form. Rendering an object in reduced form, depending on the occlusion and distance values, may comprise using a medial axis, reduced resolution, bounding box, or classifying the object as hidden (if not seen). Further, at step 316 it is determined if the selected element is the last element of the component. If it is the last element, in one embodiment process 300 returns to the next step in process 200. If it is determined that the selected element is not the last element, process 300 returns to step 312.

Figure 6:
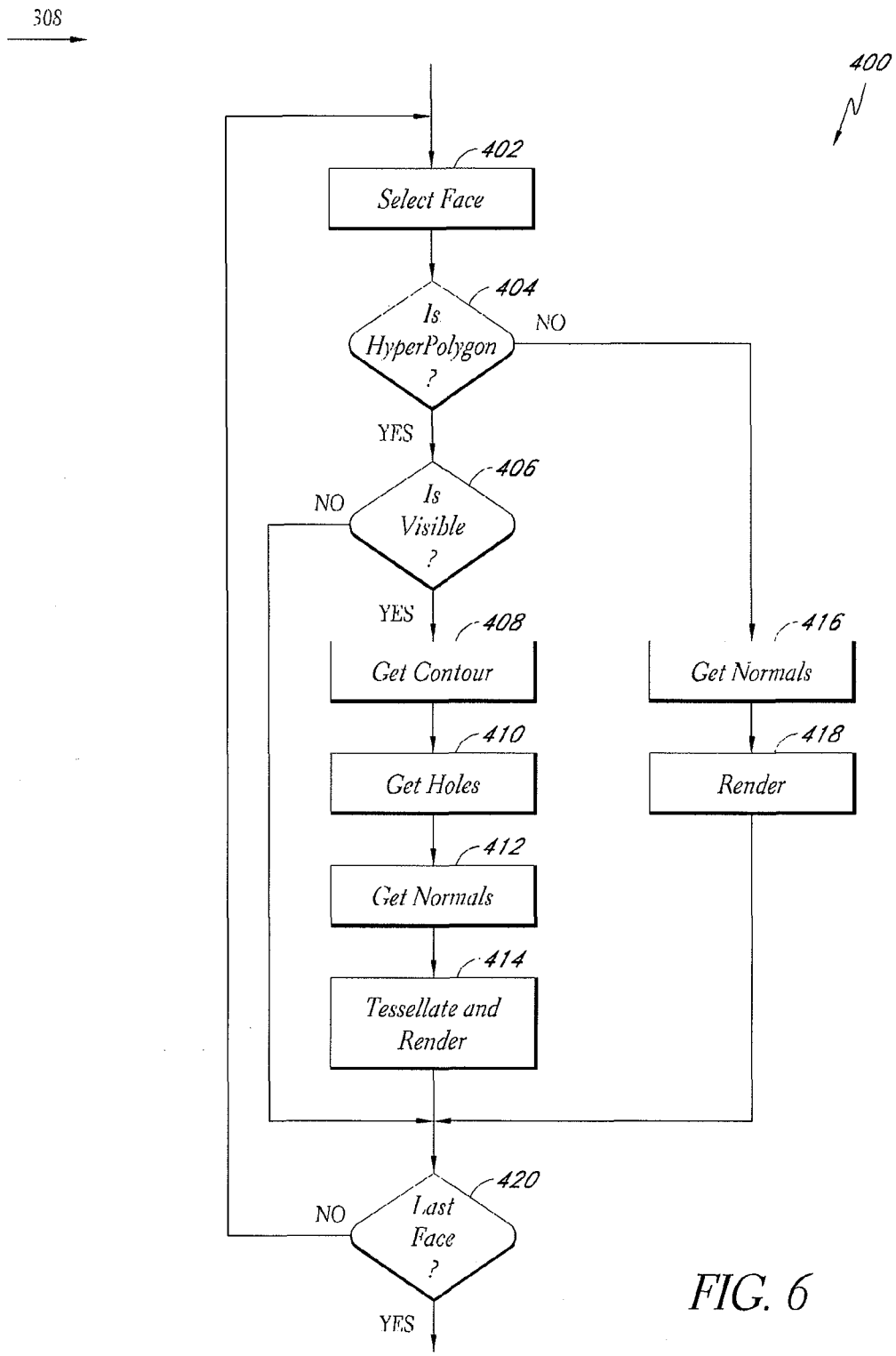
FIG. 6 is a flowchart illustrating an embodiment of rendering a hyper mesh object.

The reduced form rendering, as shown in step 314, is similar to the rendering of the hyper object described in more detail in FIGS. 6 and 7. The reduced form depends on the DLOD level set for the specified object earlier, for example, at step 242 of FIG. 4C. DLOD may be used to set a detail level, which in turn determines a sampling type. At step 314, the engine will either discard features and parts of the object or draw its maximum reduced form, which is defined by the sampling type.

FIG. 6 is a flowchart illustrating an embodiment of rendering a hyper mesh object, which is one type of hyper object. In some embodiments, process 400 corresponds to step 308 of process 300. At step 402, the next face of the hyper object is selected. In some embodiments, step 402 uses hyper face 136 from array of hyper faces 134 of FIG. 3. Continuing at step 404, it is determined if the face is of a hyper polygon type, which belong to the set of non simple types of polygons including complex polygons and surfaces. In some embodiments, the face type module 142 of FIG. 3 could be used to determine if a face is hyper polygon type. If it is determined the face is a hyper polygon type, process 400 continues to step 406. At step 406, it is determined whether the selected face is visible. The visibility is determined for hyper polygons since hyper polygons are defined as complex features which contain other features. Determining visibility is useful for performance enhancement. If it is determined the face is not visible, process 400 continues to step 420. If it is determined the selected face is visible, process 400 proceeds to step 408.

At step 408 the contour of the face is retrieved from the hyper model structure. Continuing at step 410, the holes of the face are retrieved from the hyper model structure. In some embodiments, the array of face holes 144 can be searched for a hyper face 146 of FIG. 3 and then retrieved. Further, at step 414, the normals of the face are retrieved from the hyper model structure. This can be done, in some embodiments, using normal IDs 140 in FIG. 3. At a next step 414, the face is tessellated and rendered. The process then continues to step 420.

In the alternative, if it is determined the face is not a hyper polygon (i.e., the face is a simple polygon type) process 400 continues to step 416. At step 416 the normals of the face are retrieved, in some embodiments, using normal IDs 140 in FIG. 3, and continuing at step 418, the face is rendered. The process then continues to step 420.

At step 420 it is determined whether the selected face is not the last face of the hyper object. If it is not the last face, the process returns to step 402. If the face is the last face, in some embodiments, process 400 returns to step 310 of process 300.

FIG. 7 is a flowchart illustrating an embodiment of rendering a hyper reuse object, which is another type of hyper object. In some embodiments, process 500 corresponds to step 308 of process 300. At step 502, the quaternion of the hyper object is set. This sets the rotation and orientation of the object. Further, at step 504, the translation is set. Continuing at step 506, the scale is set. Next, at a step 508, the unit solid of the hyper object is retrieved and at step 510 the unit solid is rendered. Rendering includes performing an affine transformation on the unit solid, using the scale, quaternion rotation and translation. In one embodiment, process 500 then returns to step 310 of process 300. In some embodiments, each of the steps in process 500 uses a corresponding data module from hyper reuse object 150 in FIG. 3, for example, step 502 uses data stored in quaternion module 156, step 504 uses data stored in translation module 158, step 506 uses data stored in scale module 160, and step 508 uses data stored in unit solid ID module 162.

Hyper Model Level of Details

The hyper model may also be at least partially based on a DLOD scheme to ensure that only viewable objects are processed. In some embodiments, this scheme may be implemented in step 216 of FIG. 4B, step 228 of FIG. 4C, or both. The DLOD scheme may set a detail level, as described above. In some embodiments, the detail level can then be used to determine if a component is sampled at step 304 in FIG. 5. In some embodiments, the DLOD is used in drawing a reduced form at step 314 in FIG. 5.

The DLOD scheme uses a backward integrated learning method. This method determines which objects were rendered in previous frames and the method in which they were rendered. The method includes storing a frame rate, a number of times each object is drawn, a view distance of each object from the viewpoint, and a mode in which each object is drawn. The method then uses a median equation to average these factors to determine if the rendering engine should draw the object.

The method involves a learning process that tracks user behavior. If a user turns an object in a certain direction in previous frames, the method determines the user will likely continue turning the object in the same direction, so objects viewed in the direction the user is turning are set at a higher priority to be rendered. The DLOD method also may utilize the occlusion tree in decision making.

Those of skill in the art will recognize that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

While the above detailed description has shown, described, and pointed out novel features of the invention as applied to various embodiments, it will be understood that various omissions, substitutions, and changes in the form and details of the device or process illustrated may be made by those skilled in the art without departing from the scope of the invention. As will be recognized, the invention may be embodied within a form that does not provide all of the features and benefits set forth herein, as some features may be used or practiced separately from others. The scope of the invention is indicated by the appended claims rather than by the foregoing description. All changes which come within the meaning and range of equivalency of the claims are to be embraced within their scope.

What is claimed is:

1. A computer-aided design (CAD) system, comprising:
an electronic device comprising a processor and a memory, the memory comprising:
a first module configured to represent computer-aided design objects in a virtual environment using two types of objects:
a first of the two types of objects comprising:
a plurality of sections defining a shape of an object for rendering, each section defining the shape of the object for rendering being configurably defined as one of a complex surface, at least one complex polygon, a polygon, or an array of triangles or quads;
information defining collective characteristics of the plurality of sections; and
information interconnecting at least two neighboring sections of the plurality of sections;
wherein the first module is configured to represent a first section of the plurality of sections as the complex surface, wherein the first module is configured to represent a second section of the plurality of sections as the at least one complex polygon, wherein the first module is configured to represent a third section of the plurality of sections as the polygon, and wherein the first module is configured to represent a fourth section of the plurality of sections as the array of triangles or quads, and
wherein the first module is configured to store the first section, the second section, the third section, and the fourth section in the memory;
wherein the first module is configured to represent the object for rendering in a first resolution and a second resolution,
wherein the second resolution is lower than the first resolution, and
wherein the first type of object comprises a low resolution function to represent the object for rendering in the second resolution:, and
a second of the two types of objects storing information referencing a common object in the virtual environment and one or more transformations for at least a section of the common object, wherein the second module is configured to represent a plurality of objects of the second type that store information referencing the same common object such that the same common object is stored once, and wherein the plurality of objects of the second type store are configured to store different transformations for at least a section of the same common object;
wherein the first module is configured to dynamically store objects of the first type and dynamically store objects of the second type;
a second module configured to render the computer-aided design objects in three dimensions;
wherein the processor is configured to execute the first module and the second module.

2. The system of claim 1, wherein the memory further comprises a third module configured to generate objects of the first type and objects of the second type from design objects, the design objects comprising at least one of a constructive solid geometry and a boundary representation.

3. The system of claim 2, wherein the memory further comprises a fourth module configured to:
transform properties of complex surfaces to properties of one of the two types of objects; and
dynamically update the properties of one of the two types of objects.

4. The system of claim 1, wherein the memory further comprises a fifth module configured to edit a feature of the first and second types of objects.

5. The system of claim 1, wherein the common object comprises an object of the first type.

6. The system of claim 1, wherein each of the computer-aided design objects comprises:
information identifying bounds of said computer-aided design object in the virtual environment;
visibility information identifying whether portions of said computer-aided design object are visible from a viewpoint
transparency information identifying whether portions of said computer-aided design object are opaque; and
an element object describing one of the two types of objects, the element object comprising medial axis information, information representing bounds of the element object in the virtual environment, and data sufficient for the second module to render the element object.

7. The system of claim 6, wherein:
the computer-aided design object further comprises a component object comprising:
the element object, information representing bounds of the component object in the virtual environment, the visibility information, and the transparency information; and
the second module is configured to:
use the visibility information in deciding whether to render the component object; and
use the transparency information in rendering the component object.

8. The system of claim 7, wherein the second module groups component objects for rendering based on a common property, the common property being indicative of at least one of transparency or a material of component objects for rendering.

9. The system of claim 1, wherein the computer-aided design objects are configured to update dynamically and the second module is configured to render the computer-aided design objects dynamically.

10. The system of claim 1, wherein the second module is configured to render at least a portion of one of the computer-aided design objects in a reduced form in the virtual environment.

11. The system of claim 10, wherein the reduced form chosen is based on a distance from a viewpoint and a pixel count of the computer-aided design object.

12. A method of rendering three dimensional shapes on an electronic device, comprising:
selecting computer-aided design objects stored in a memory, wherein said computer-aided design objects comprise two types of objects:
a first of the two types of objects comprising:
a plurality of sections defining a shape of an object for rendering, each section defining the shape of the object for rendering being configurably defined as one of a complex surface, a complex polygon, a polygon, and an array of triangles or quads;
information defining collective characteristics of the plurality of sections; and
information interconnecting at least two neighboring sections of the plurality of sections;
wherein a single section of the plurality of sections is configured to be any of the complex surface, the complex polygon, the polygon, and the array of triangles or quads;
wherein the first type of object is configured to represent the object for rendering in a first resolution and a second resolution, wherein the second resolution is lower than the first resolution, and wherein the first type of object comprises a low resolution function to represent the object for rendering in the second resolution; and
a second of the two types of objects storing information referencing a common object in a virtual environment and one or more transformations for at least a section of the common object, wherein a plurality of the computer-aided design objects of the second type store information referencing the same common object such that the same common object is stored once in the memory; and
rendering a group of said computer-aided design objects of the first type and the second type on the electronic device.

13. The method of claim 12, further comprising generating objects of the first type and objects of the second type from design objects, wherein the design objects comprise at least one of a constructive solid geometry, a boundary representation, or a set of geometric entities and simplexes representing a surface.

14. The method of claim 13, further comprising:
transforming properties of any of the constructive solid geometry, the boundary representation, or the set of geometric entities and simplexes representing a surface to properties of one of the two types of objects; and
updating the properties of one of the two types of objects.

15. The method of claim 12, further comprising editing a feature of the first type of object.

16. The method of claim 12, wherein the common object comprises the first type of object.

17. The method of claim 12, wherein each of the computer-aided design objects comprises:
information identifying bounds of said computer-aided design object in the virtual environment; and
an element object describing one of the two types of objects, the element object comprising medial axis information, information representing bounds of the element object in the virtual environment, and data sufficient for the second module to render the element object.

18. The method of claim 17, wherein:
the computer-aided design object further comprises a component object comprising the element object, information representing bounds of the component object in the virtual environment, visibility information identifying whether portions of said computer-aided design object are visible from a viewpoint, and transparency information identifying whether portions of said computer-aided design object are opaque; and
the second module is configured to:
use the visibility information in deciding whether to render the component object; and
use the transparency information in rendering the component object.

19. The method of claim 18, further comprising grouping component objects for said rendering based on a common property.

20. The method of claim 12, further comprising:
updating the computer-aided design objects dynamically; and
dynamically rendering the computer-aided design objects.

21. The method of claim 12, wherein said rendering comprises illustrating at least a portion of one of the computer-aided design object in a reduced form in the virtual environment.

22. The method of claim 21, wherein the reduced form is based on a distance from a viewpoint and a pixel count of the computer-aided design object.

23. A computer-aided design (CAD) system, comprising:
an electronic device comprising:
 means for representing computer-aided design objects in a virtual environment using two types of objects:
  a first of the two types of objects comprising:
   means for modeling a plurality of sections defining a shape of an object for rendering, each section defining the shape of the object for rendering being configurably defined as one of a complex surface, a complex polygon, a polygon, and an array of triangles or quads;
   means for storing information defining collective characteristics of the plurality of sections;
   means for storing information interconnecting at least two neighboring sections of the plurality of sections; and
   means for representing the object for rendering in a first resolution and a second resolution, wherein the second resolution is lower than the first resolution;
   wherein a single section of the plurality of sections is configured to be any one of the complex surface, the complex polygon, a polygon, and the array of triangles or quads; and
  a second of the two types of objects comprising:
   means for storing information referencing a common object in the virtual environment, wherein a plurality of computer-aided design objects store information referencing the same common object such that the same common object is stored once in memory; and
   means for performing at least one transformation on at least a section of the common object;
   wherein the means for representing computer-aided design objects is configured to dynamically store the two types of objects; and
 means for rendering the computer-aided design objects in three dimensions.

24. The method of claim 12, wherein the single section is configured to be any one selected from a group consisting of the complex surface, the complex polygon, the polygon, and the array of triangles or quads.

25. The system of claim 1, wherein the first type of object comprises an array of hyper faces, each hyper face configured to represent a surface of the object for rendering, the surface comprising a section of the plurality of sections, wherein the array of hyper faces is configured to represent a first hyper face by at least one of a complex surface and a complex polygon, and wherein the array of hyper faces is configured to represent a second hyper face by a plurality of triangles, and wherein at least one of the hyper faces comprises an array of face holes representing a hole in the at least one of the hyper faces as another hyper face, wherein the another hyper face can be edited separately from the at least one of the hyper faces.

26. The system of claim 25, wherein the first type of object is configured to represent a constructive solid geometry object.

27. A method of rendering three dimensional shapes on an electronic device, comprising:
 selecting computer-aided design objects stored in a memory, wherein said computer-aided design objects comprise two types of objects:
  a first of the two types of objects comprising:
   a plurality of sections defining a shape of an object for rendering, each section defining the shape of the object for rendering being configurably defined as one of a complex surface, a complex polygon, a polygon, and an array of triangles or quads;
   information defining collective characteristics of the plurality of sections; and
   information interconnecting at least two neighboring sections of the plurality of sections;
   wherein a single section of the plurality of sections is configured to be any of the complex surface, the complex polygon, the polygon, and the array of triangles or quads; and
  a second of the two types of objects storing information referencing a common object in the virtual environment and one or more transformations for at least a section of the common object, wherein a plurality of the computer-aided design objects of the second type store information referencing the same common object such that the same common object is stored once in the memory;
 wherein objects of the first type and objects of the second type are stored in at least 200 megabytes (MB) of the memory; and
 rendering a group of said computer-aided design objects of the first type and the second type on the electronic device.

28. A computer system comprising:
 a processor configured to:
  represent computer-aided design objects in a virtual environment by storing two types of objects in memory, the two types of objects comprising:
   a first of the two types of objects comprising:
    a plurality of sections defining a shape of an object for rendering, each section defining the shape of the object for rendering being configurably defined as one of a complex surface, at least one complex polygon, a polygon, or an array of triangles or quads;
    information defining collective characteristics of the plurality of sections; and
    information interconnecting at least two neighboring sections of the plurality of sections;
    wherein the processor is configured to represent a first section of the plurality of sections as the complex surface, wherein the processor is configured to represent a second section of the plurality of sections as the at least one complex polygon, wherein the processor is configured to represent a third section of the plurality of sections as the polygon, and wherein the processor is configured to represent a fourth section of the plurality of sections as the array of triangles or quads,
    wherein the processor is configured to represent the object for rendering in a first resolution and a second resolution, wherein the second resolution is lower than the first resolution, and wherein the first type of object comprises a low resolution function to represent the object for rendering in the second resolution; and
   a second of the two types of objects storing information referencing a common object in the virtual environment and one or more transformations for at least a section of the common object, wherein the second module is configured to represent a plurality of objects of the second type that store information referencing the same common object such that the same common object is stored once, and wherein the plurality of objects of the second type store are configured to store different transformations for at least a section of the same common object;

dynamically store objects of the first type and dynamically store objects of the second type; and render the computer-aided design objects in three dimensions.

* * * * *